(12) United States Patent
Kim et al.

(10) Patent No.: US 10,319,694 B2
(45) Date of Patent: Jun. 11, 2019

(54) SEMICONDUCTOR ASSEMBLY AND METHOD OF MAKING SAME

(71) Applicant: QUALCOMM Incorporated, San Diego, CA (US)

(72) Inventors: Daniel Daeik Kim, Del Mar, CA (US); Jie Fu, San Diego, CA (US); Manuel Aldrete, Encinitas, CA (US); Jonghae Kim, San Diego, CA (US); Changhan Hobie Yun, San Diego, CA (US); David Francis Berdy, San Diego, CA (US); Chengjie Zuo, San Diego, CA (US); Mario Francisco Velez, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/233,902

(22) Filed: Aug. 10, 2016

(65) Prior Publication Data

US 2018/0047687 A1 Feb. 15, 2018

(51) Int. Cl.
*H01L 23/00* (2006.01)
*H01L 23/31* (2006.01)
(Continued)

(52) U.S. Cl.
CPC ............ *H01L 24/09* (2013.01); *H01L 21/563* (2013.01); *H01L 23/3157* (2013.01); *H01L 23/3675* (2013.01); *H01L 23/3677* (2013.01); *H01L 23/481* (2013.01); *H01L 23/49816* (2013.01); *H01L 24/03* (2013.01); *H01L 24/11* (2013.01); *H01L 24/14* (2013.01); *H01L 24/06* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/0401* (2013.01); *H01L 2224/0557* (2013.01); *H01L 2224/06181* (2013.01); *H01L 2224/131* (2013.01); *H01L 2224/14051* (2013.01);
(Continued)

(58) Field of Classification Search
CPC ..... H01L 24/09; H01L 24/11; H01L 23/3157; H01L 23/3675; H01L 21/563
See application file for complete search history.

(56) References Cited

U.S. PATENT DOCUMENTS 7,129,570 B2   10/2006  Meyer-Berg
8,759,950 B2   6/2014   Kamgaing et al.
(Continued)

OTHER PUBLICATIONS

International Search Report and Written Opinion—PCT/US2017/043127—ISA/EPO—dated Oct. 25, 2017.

*Primary Examiner* — Christine A Enad
(74) *Attorney, Agent, or Firm* — Muncy, Geissler, Olds & Lowe, P.C.

(57) ABSTRACT

A semiconductor device according to some examples of the disclosure may include a package substrate, a semiconductor die coupled to one side of the package substrate with a first set of contacts on an active side of the semiconductor die and coupled to a plurality of solder prints with a second set of contacts on a back side of the semiconductor die. The semiconductor die may include a plurality of vias connecting the first set of contacts to the second set of contacts and configured to allow heat to be transferred from the active side of the die to the plurality of solder prints for a shorter heat dissipation path.

21 Claims, 6 Drawing Sheets

(51) Int. Cl.
  *H01L 23/367* (2006.01)
  *H01L 21/56* (2006.01)
  *H01L 23/48* (2006.01)
  *H01L 23/498* (2006.01)
(52) U.S. Cl.
  CPC ............ *H01L 2224/14181* (2013.01); *H01L 2224/16227* (2013.01); *H01L 2224/32225* (2013.01); *H01L 2224/73204* (2013.01); *H01L 2224/92125* (2013.01); *H01L 2924/15321* (2013.01)

(56) References Cited

U.S. PATENT DOCUMENTS

| | | | |
|---|---|---|---|
| 8,829,674 B2 * | 9/2014 | Ayotte | H01L 24/81 257/737 |
| 8,901,688 B2 | 12/2014 | Kamgaing | |
| 2002/0041027 A1 | 4/2002 | Sugizaki | |
| 2011/0042820 A1 * | 2/2011 | Knickerbocker | H01L 21/76898 257/774 |
| 2011/0074028 A1 | 3/2011 | Pendse | |
| 2011/0140126 A1 | 6/2011 | Gaul et al. | |
| 2011/0186990 A1 | 8/2011 | Mawatari et al. | |
| 2012/0299197 A1 | 11/2012 | Kwon et al. | |
| 2013/0214426 A1 | 8/2013 | Zhao et al. | |
| 2014/0070368 A1 * | 3/2014 | Oyamada | H01L 25/0657 257/532 |
| 2014/0183723 A1 * | 7/2014 | Ayotte | H01L 24/81 257/737 |
| 2015/0228591 A1 * | 8/2015 | Kim | H01L 24/17 257/692 |
| 2016/0035693 A1 * | 2/2016 | Graf | H01L 25/105 438/107 |
| 2016/0227641 A1 * | 8/2016 | Ku | H05K 1/0206 |

* cited by examiner

SEMICONDUCTOR ASSEMBLY AND METHOD OF MAKING SAME

FIELD OF DISCLOSURE

This disclosure relates generally to semiconductor assemblies, and more specifically, but not exclusively, to semiconductor assemblies with improve thermal and electrical characteristics.

BACKGROUND

Semiconductor assemblies may be configured and used for many purposes. One such purpose is a power amplifier semiconductor assembly. A radio frequency power amplifier (RF power amplifier) is a type of electronic amplifier that converts a low-power radio-frequency signal into a higher power signal. Typically, RF power amplifiers drive the antenna of a transmitter, such as in a mobile phone. Design goals often include gain, power output, bandwidth, power efficiency, linearity (low signal compression at rated output), input and output impedance matching, and heat dissipation. Power amplifier semiconductor packages generally generate a couple watts of heat during operation that needs to be dissipated. The increased heat will affect the efficiency of the PA and make the PA more lossy. In addition, RF power amplifier semiconductor packages need short chip to ground plane distances to prevent parasitic losses. Thus, there is a need for a high-performance power amplifier (PA) semiconductor package assembly including: minimal thermal resistance to maximize PA efficiency, minimal wiring RF signal parasitics for PA power delivery, a simplified ground path, and thermal path simplification.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a device comprises: a package substrate with a first side; a plurality of first solder balls coupled to the first side of the package substrate along a perimeter of the package substrate, the plurality of first solder balls configured to electrically couple the package substrate to a printed circuit board opposite the package substrate; a plurality of second solder balls coupled to the first side between the plurality of first solder balls; a first set of contacts coupled to the plurality of second solder balls opposite the first side; a semiconductor die with an active side, a back side opposite the active side, a plurality of vias configured to couple the active side to the back side, and the active side coupled to the first set of contacts opposite the plurality of second solder balls; a second set of contacts coupled to the back side wherein at least one of the second set of contacts connects to two or more of the plurality of vias; and a plurality of solder prints coupled to the second set of contacts and the printed circuit board.

In another aspect, a device comprises: a package substrate with a first side; a first means for connection coupled to the first side along a perimeter of the package substrate, the first means configured to electrically couple the package substrate to a printed circuit board opposite the package substrate; a second means for connection coupled to the first side between the first means for connection; a first set of contacts on the second means for connection opposite the first side; a semiconductor die with an active side, a back side opposite the active side, a plurality of vias configured to couple the active side to the back side, and the active side coupled to the first set of contacts opposite the second means for connection; a second set of contacts coupled to the back side wherein at least one of the second set of contacts connects to two or more of the plurality of vias; and a third means for connection coupled to the second set of contacts and the printed circuit board.

In still another aspect, a device comprises: a package substrate with a first side; first means for connection coupled to the first side along a perimeter of the package substrate, the first means for connection configured to electrically couple the package substrate to a printed circuit board opposite the package substrate; second means for connection coupled to the first side between the first means for connection; a first set of contacts on the second means for connection opposite the first side; a semiconductor die with an active side, a back side opposite the active side, and the active side coupled to the first set of contacts opposite the second means for connection; means for heat transfer connected between the first set of contacts and a second set of contacts, the means for heat transfer configured to transfer heat from the active side to the back side; the second set of contacts coupled to the back side wherein at least one of the second set of contacts connects to two or more means for heat transfer; and third means for connection coupled to the second set of contacts and the printed circuit board.

In still another aspect, a method for manufacturing a device comprises: forming a package substrate; forming a plurality of first solder balls on a first side of the package substrate along a perimeter of the package substrate, the plurality of first solder balls configured to electrically couple the package substrate to a printed circuit board opposite the package substrate; forming a plurality of second solder balls on the first side of the package substrate between the plurality of first solder balls; attaching a semiconductor die to the plurality of second solder balls; and forming a plurality of solder prints on the semiconductor die opposite the plurality of second solder balls and configured to connect to the printed circuit board.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
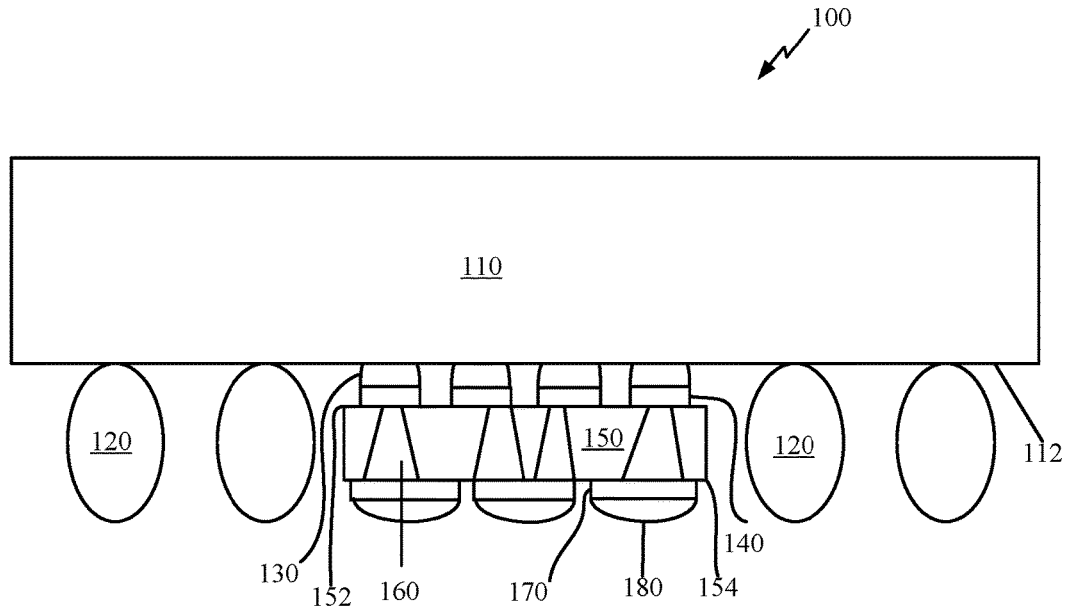
FIG. 1 illustrates an exemplary semiconductor device in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein address the industry needs, as well as other previously unidentified needs, and mitigate shortcomings of the conventional methods, apparatus, and systems. For example, a semiconductor device according to some examples of the disclosure may include a package substrate, a semiconductor die coupled to one side of the package substrate with a first set of contacts on an active side of the semiconductor die and coupled to a plurality of solder prints with a second set of contacts on a back side of the semiconductor die. The semiconductor die may include a plurality of vias connecting the first set of contacts to the second set of contacts and configured to allow heat to be transferred from the active side of the die to the plurality of solder prints for a shorter heat dissipation path.

FIG. 1 illustrates an exemplary semiconductor device in accordance with some examples of the disclosure. As shown in FIG. 1, a device 100 (e.g. a semiconductor device) may include a package substrate 110 with a first side 112, a plurality of first solder balls 120 coupled to the first side 112 of the package substrate 110 along a perimeter of the package substrate 110, a plurality of second solder balls 130 coupled to the first side 112 between the plurality of first solder balls 120, a first set of contacts 140 on the plurality of second solder balls 130 opposite the first side 112, a semiconductor die 150 with an active side 152 coupled to the first set of contacts 140 and a back side 154 opposite the active side 152, a plurality of vias 160 coupling the active side 152 to the back side 154, a second set of contacts 170 coupled to the back side 154, and a plurality of solder prints 180 coupled to the second set of contacts 170. As used herein, an active side (e.g. active side 152) of a semiconductor die may include the portion of the die having active components such as transistors and the back side (e.g. back side 154) of a semiconductor die may be opposite the active side. As shown in FIG. 1, at least one of the second set of contacts 170 may connect to two of the plurality of vias 160, but it should be understood that more than one of the second set of contacts 170 may be connected to two or more of the plurality of vias 160. By doing so, the thermal dissipation or heat transfer properties of the device 100 may be enhanced. The plurality of solder prints 180 may be configured to provide external connection points for the semiconductor die 150, such as for a ground path or electrical signal paths. Contact points of the plurality of solder prints 180 may be coplanar with contact points of the plurality of first solder balls 120 such that the semiconductor device 100 may be attached in a level manner to a printed circuit board, for example.

The package substrate 110 may be a wafer level package, a fan out wafer level package, or a flip chip ball grid array configuration, for example. The plurality of first solder balls 120 may be a ball grid array or balls with a copper core surrounded by solder such that during a reflow process the height of the balls may be controlled more accurately. While FIG. 1 shows a double row of solder balls 120 around the perimeter of the package substrate 110, it should be understood that this could be more or less. While FIG. 1 shows four rows of solder balls 130, it should be understood that this could be more or less. The semiconductor die 150 may be a semiconductor memory die, a semiconductor logic die, an integrated circuit, an integrated circuit device, or similar device. The semiconductor device 100 may include an optional underfill (See underfill 232 of FIG. 2) that encapsulates the plurality of second solder balls 130 and the first set of contacts 140. The plurality of solder prints 180 may be land grid array pads or similar structures.

Figure 2:
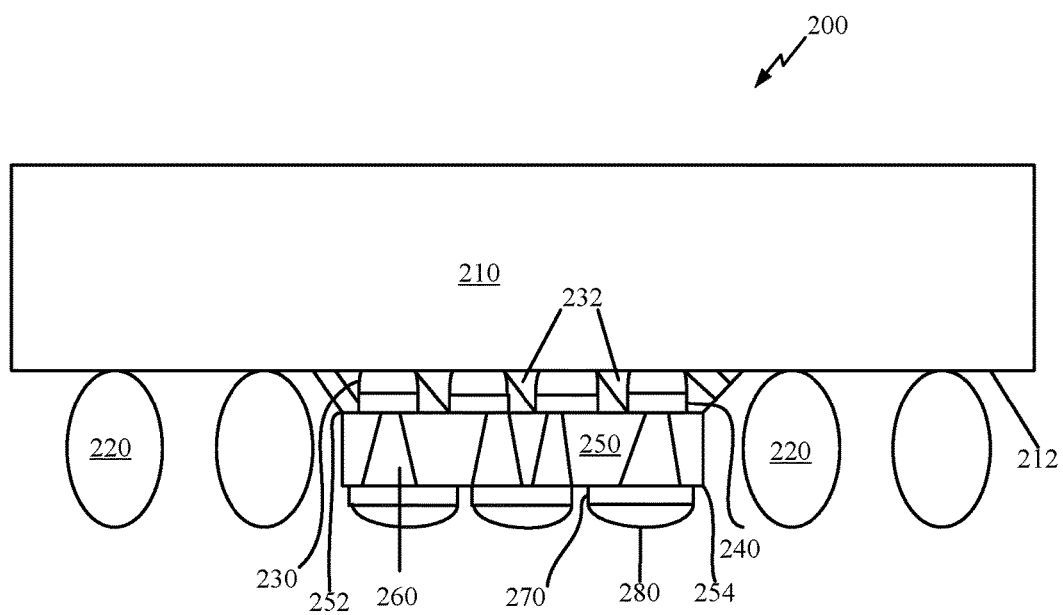
FIG. 2 illustrates a side view of an exemplary semiconductor device with underfill in accordance with some examples of the disclosure.

The plurality of vias 160 may include landing pads on both ends for coupling to the first set of contacts 140 and the second set of contacts 170. The plurality of vias 160 may be filled with an electrically and thermally conductive material such that heat generated in the active side 152 may be transferred to the back side 154 in as short a distance as possible to improve the thermal dissipation of the semiconductor device 100. Thus, the heat generated by the semiconductor die 150 may be quickly transferred to a printed circuit board (not shown) coupled to the plurality of first solder balls 120 and the plurality of solder prints 180 instead of having to travel through the package substrate 110 as would occur in a conventional configuration. In addition, the electrical conductivity of the plurality of vias 160 may provide a short ground path for the semiconductor die to a ground in the printed circuit board as well as a short signal path to external connections FIG. 2 illustrates a side view of an exemplary semiconductor device with underfill in accordance with some examples of the disclosure. As shown in FIG. 2, a semiconductor device 200 may include a package substrate 210 (e.g. package substrate 110) with a first side 212, a first means for connection 220 (e.g. plurality of first solder balls 120) coupled to the first side 212 along a perimeter of the package substrate 210, a second means for connection 230 (e.g. plurality of second solder balls 130) coupled to the first side 212 between the first means for connection 220, a first set of contacts 240 on the second means for connection 230 opposite the first side 212, an underfill 232 that encapsulates the first means for connection 220 and the first set of contacts 232, a semiconductor die 250 with an active side 252 coupled to the first set of contacts 240 and a back side 254 opposite the active side 252, a means for heat transfer 260 (e.g. plurality of vias 160) coupling the active side 252 to the back side 254, a second set of contacts 270 coupled to the back side 254, and a third means for connection 280 (e.g. plurality of solder prints 180) coupled to the second set of contacts 270. The third means for connection 280 may be configured to provide external connection points for the semiconductor die 250, such as for a ground path or electrical signal paths. Contact points of the third means for connection 280 may be coplanar with contact points of the first means for connection 220 such that the semiconductor device 200 may be attached in a level manner to a printed circuit board, for example. The means for heat transfer 260 may provide a thermal path to dissipate heat generated by the semiconductor die 250 to an external heat spreader and may also provide a signal path for signals from the active side 252 of the semiconductor die 250 to an external connection.

Figure 3A:
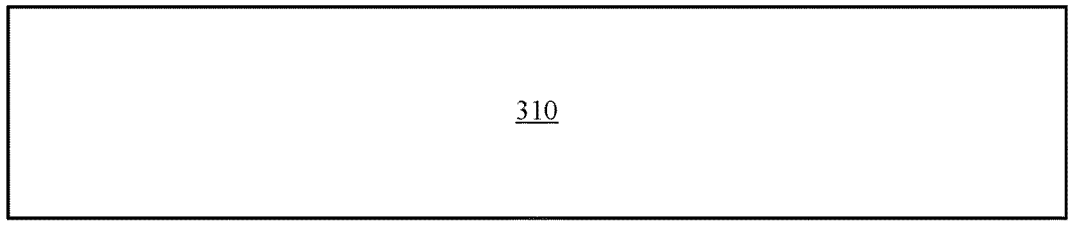
FIGS. 3A-D illustrate an exemplary method for manufacture of a semiconductor device with underfill in accordance with some examples of the disclosure.
Figure 3B:
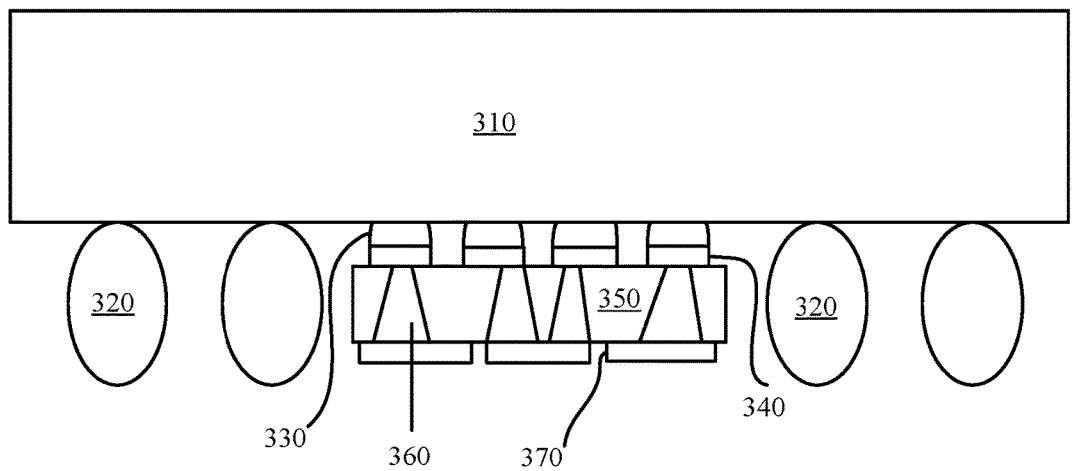
Figure 3C:
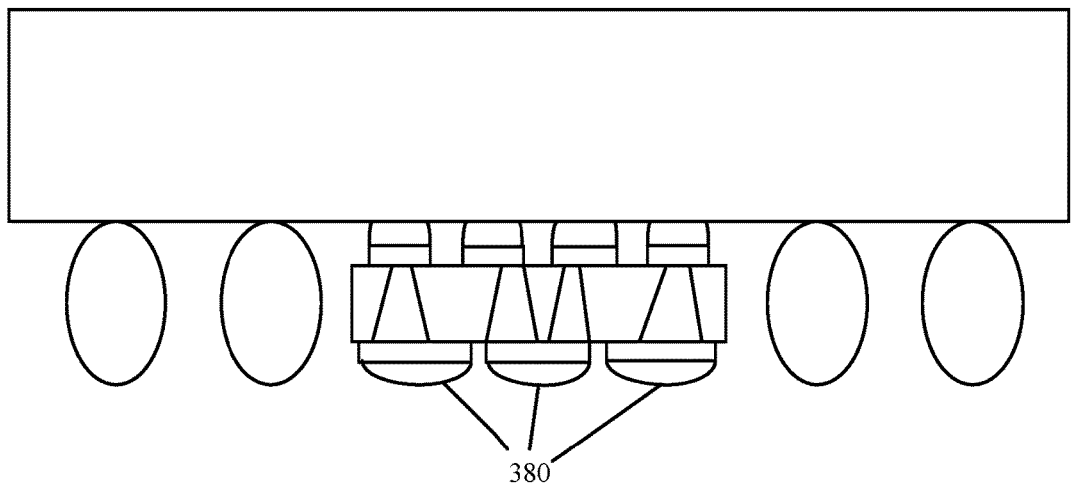
Figure 3D:

FIGS. 3A-D illustrate an exemplary method for manufacture of a semiconductor device 300 with underfill in accordance with some examples of the disclosure. As shown in FIG. 3A, a package substrate 310 (e.g. package substrate 110) may be formed by conventional processes. As shown in FIG. 3B, a plurality of first solder balls 320 (e.g. plurality of first solder balls 120) may be coupled to the package substrate 310, a plurality of second solder balls 330 (e.g. plurality of second solder balls 130) may be coupled to the package substrate 310 between the plurality of first solder balls 320, a first set of contacts 340 (e.g. first set of contacts 140) may be formed on the plurality of second solder balls 330, a semiconductor die 350 (e.g. semiconductor die 150) with a plurality of vias 360 (e.g. plurality of vias 160) may be coupled to the first set of contacts 340, and a second set of contacts 370 (e.g. second set of contacts 170) may be formed on the semiconductor die 350 opposite the first set of contacts 340. A reflow process may then be applied to reflow at least the plurality of second solder balls 330. As shown in FIG. 3C, a plurality of solder prints 380 (e.g. plurality of solder prints 180) may be formed on the second set of contacts 370 opposite the semiconductor die 350 by a paste print or similar process such that the contact points of the plurality of solder prints 380 are coplanar with the contact points of the plurality of first solder balls 320. As shown in FIG. 3D, an optional underfill 332 (e.g. underfill 232) may be applied to encapsulate the plurality of second solder balls 330 and the first set of contacts 340 to form a semiconductor device 300 (e.g. semiconductor device 100). The plurality of vias 360 may be formed before the semiconductor die 350 is attached or after by a suitable process, such as laser drilling etc., and the first set of contacts 340 and the second set of contacts 370 may be attached to the semiconductor die 350 before the semiconductor die is attached.

Figure 4:
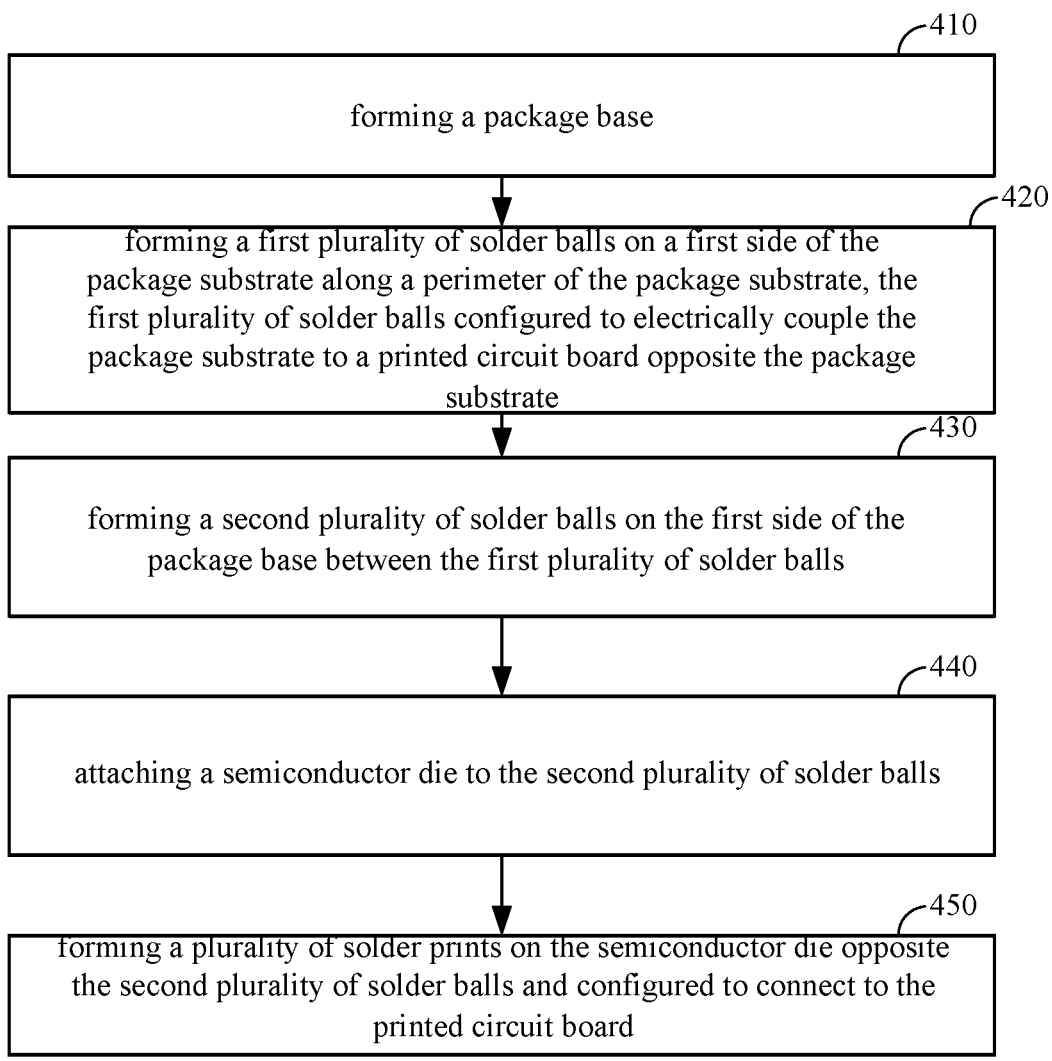
FIG. 4 illustrates an exemplary method for manufacture of a semiconductor device in accordance with some examples of the disclosure.

FIG. 4 illustrates an exemplary method for manufacture of a semiconductor device in accordance with some examples of the disclosure. The method begins in block 410 with forming a package substrate (e.g. package substrate 110). Next in block 420, the method continues with forming a plurality of first solder balls (e.g. plurality of first solder balls 110) on a first side of the package substrate along a perimeter of the package substrate. Next in block 430, the method continues with forming a plurality of second solder balls (e.g. plurality of second solder balls 130) on the first side of the package substrate between the plurality of first solder balls. Next in block 440, the method continues with attaching a semiconductor die (e.g. semiconductor die 150) to the plurality of second solder balls. Next in block 450, the method concludes with forming a plurality of solder prints on the semiconductor die opposite the plurality of second solder balls. The method of FIG. 4 may also include the actions of (a) forming a first set of contacts on the plurality of second solder balls and attaching the semiconductor die to the first set of contacts, (b) forming a second set of contacts on the semiconductor die and attaching the plurality of solder prints to the second set of contacts, (c) forming a plurality of vias in the semiconductor die and coupling the first set of contacts to the second set of contacts with the plurality of vias, (d) encapsulating the plurality of second solder balls and the second set of contacts with an underfill, and (e) wherein the package substrate is one of a wafer-level package, a fan-out wafer level package, or a flip chip ball grid array.

Figure 5:
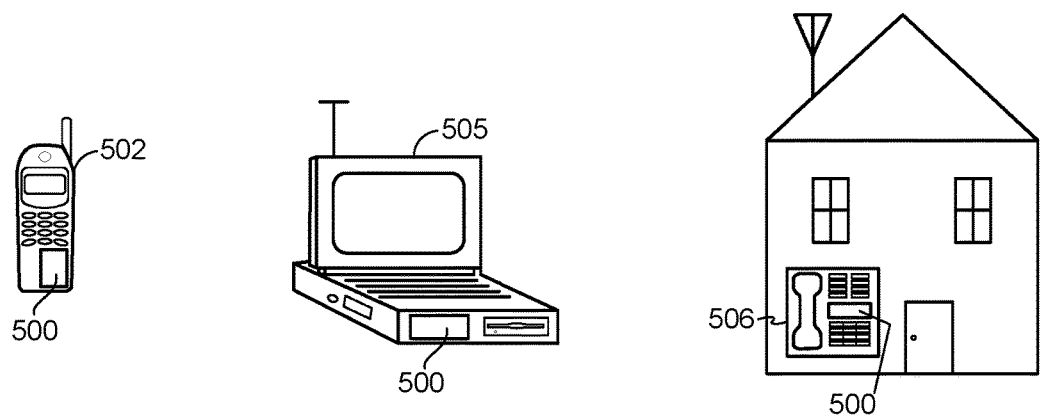
FIG. 5 illustrates various electronic devices that may be integrated with the aforementioned semiconductor device in accordance with some examples of the disclosure.

FIG. 5 illustrates various electronic devices that may be integrated with any of the aforementioned semiconductor devices 100, 200, or 300, such as an integrated device, semiconductor device, integrated circuit, or die in accordance with some examples of the disclosure. For example, a mobile phone device 502, a laptop computer device 505, and a fixed location terminal device 506 may include an integrated device 500 as described herein. The integrated device 500 may be, for example, any of the integrated circuits, dies, or integrated devices described herein. The devices 502, 505, 506 illustrated in FIG. 5 are merely exemplary. Other electronic devices may also feature the integrated device 500 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1, 2, 3A-D, and/or 4 may be rearranged and/or combined into a single component, process, feature or function or embodied in several components, processes, or functions. Additional elements, components, processes, and/or functions may also be added without departing from the disclosure. It should also be noted that FIGS. 1, 2, 3A-D, 4 and/or 5 and its corresponding description in the present disclosure is not limited to dies and/or ICs. In some implementations, FIGS. 1, 2, 3A-D, and/or 4 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A device comprising:
   a package substrate, the package substrate comprises a first side;
   a plurality of first solder balls directly coupled to the first side of the package substrate along a perimeter of the package substrate, the plurality of first solder balls configured to electrically couple the package substrate to a printed circuit board opposite the package substrate;
   a plurality of second solder balls directly coupled to the first side of the package substrate between the plurality of first solder balls;
   a first set of contacts coupled to the plurality of second solder balls opposite the first side of the package substrate;
   a semiconductor die, the semiconductor die comprises an active side, a back side opposite the active side;
   a plurality of vias configured to couple the active side to the back side and configured to transfer heat from the active side to a plurality of solder prints, each of the plurality of vias tapered in a straight line from a wide portion proximate to the back side to a narrow portion proximate the active side, and wherein the active side of the semiconductor die is directly coupled to the first set of contacts opposite the plurality of second solder balls; and
   a second set of contacts coupled to the back side wherein at least one of the second set of contacts connects to two or more of the plurality of vias;
   wherein the plurality of solder prints are coupled to the second set of contacts and the printed circuit board and form a land grid array.

2. The device of claim 1, wherein contact points of the plurality of solder prints are coplanar with contact points of the plurality of first solder balls.

3. The device of claim 1, further comprising an underfill that encapsulates the plurality of second solder balls and the first set of contacts.

4. The device of claim 1, wherein the package substrate is one of a wafer-level package, a fan-out wafer level package, or a flip chip ball grid array.

5. The device of claim 1, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

6. A device comprising:
a package substrate, the package substrate comprises a first side;
a first means for connection directly coupled to the first side of the package substrate along a perimeter of the package substrate, the first means configured to electrically couple the package substrate to a printed circuit board opposite the package substrate;
a second means for connection directly coupled to the first side of the package substrate between the first means for connection;
a first set of contacts on the second means for connection opposite the first side of the package substrate;
a semiconductor die, the semiconductor die comprises an active side, a back side opposite the active side;
a plurality of vias configured to couple the active side to the back side and configured to transfer heat from the active side to a third means for connection, each of the plurality of vias tapered in a straight line from a wide portion proximate to the back side to a narrow portion proximate the active side, and wherein the active side of the semiconductor die is directly coupled to the first set of contacts opposite the second means for connection; and
a second set of contacts coupled to the back side wherein at least one of the second set of contacts connects to two or more of the plurality of vias;
wherein the third means for connection is coupled to the second set of contacts and the printed circuit board and forms a land grid array.

7. The device of claim 6, wherein contact points of the third means for connection are coplanar with contact points of the first means for connection.

8. The device of claim 6, further comprising an underfill that encapsulates the second means for connection and the first set of contacts.

9. The device of claim 6, wherein the package substrate is one of a wafer-level package, a fan-out wafer level package, or a flip chip ball grid array.

10. The device of claim 6, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

11. A device comprising:
a package substrate, the package substrate comprises a first side;
first means for connection directly coupled to the first side of the package substrate along a perimeter of the package substrate, the first means for connection configured to electrically couple the package substrate to a printed circuit board opposite the package substrate;
second means for connection directly coupled to the first side of the package substrate between the first means for connection;
a first set of contacts on the second means for connection opposite the first side of the package substrate;
a semiconductor die, the semiconductor die comprises an active side, a back side opposite the active side, and wherein the active side of the semiconductor die is directly coupled to the first set of contacts opposite the second means for connection;
means for heat transfer connected between the first set of contacts and a second set of contacts, the means for heat transfer configured to transfer heat from the active side of the semiconductor die to a third means for connection, each of the means for heat transfer tapered in a straight line from a wide portion proximate to the back side to a narrow portion proximate the active side; and
the second set of contacts coupled to the back side wherein at least one of the second set of contacts connects to two or more means for heat transfer;
wherein the third means for connection is coupled to the second set of contacts and the printed circuit board and forms a land grid array.

12. The device of claim 11, wherein contact points of the third means for connection are coplanar with contact points of the first means for connection.

13. The device of claim 11, further comprising an underfill that encapsulates the second means for connection and the first set of contacts.

14. The device of claim 11, wherein the package substrate is one of a wafer-level package, a fan-out wafer level package, or a flip chip ball grid array.

15. The device of claim 11, wherein the means for heat transfer is a plurality of electrically and thermally conductive vias.

16. The device of claim 15, wherein the means for heat transfer extends within the semiconductor die between the active side and the back side.

17. The semiconductor die of claim 16, wherein one of the plurality of electrically and thermally conductive vias extends between each of the first set of contacts and each of the second set of contacts.

18. The device of claim 11, wherein the device is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

19. A method for manufacturing a device, comprising:
forming a package substrate;
forming a plurality of first solder balls directly on a first side of the package substrate along a perimeter of the package substrate, the plurality of first solder balls configured to electrically couple the package substrate to a printed circuit board opposite the package substrate;
forming a plurality of second solder balls directly on the first side of the package substrate between the plurality of first solder balls;
forming a first set of contacts on the plurality of second solder balls and attaching a semiconductor die to the first set of contacts;

forming a plurality of vias in the semiconductor die, wherein the plurality of vias are configured to transfer heat from an active side of the semiconductor die to a back side of the semiconductor die, each of the plurality of vias tapered in a straight line from a wide portion proximate to the back side to a narrow portion proximate the active side and wherein the active side of the semiconductor die is directly coupled to the first set of contacts opposite the plurality of second solder balls;

forming a second set of contacts on the back side, wherein at least two of the plurality of vias are connected to one of the second set of contacts; and forming a plurality of solder prints on the back side configured to connect to the printed circuit board and form a land grid array.

20. The method of claim 19, further comprising encapsulating the plurality of second solder balls and the second set of contacts with an underfill.

21. The method of claim 19, wherein the package substrate is one of a wafer-level package, a fan-out wafer level package, or a flip chip ball grid array.

* * * * *